United States Patent
Han et al.

(10) Patent No.: US 9,590,321 B2
(45) Date of Patent: Mar. 7, 2017

(54) CABLE CONNECTION STRUCTURE OF CAMERA MODULE FOR VEHICLE

(75) Inventors: Sangyeal Han, Seoul (KR); Heungsun Kim, Seoul (KR); Bumsig Cho, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 45 days.

(21) Appl. No.: 14/234,596

(22) PCT Filed: Jul. 2, 2012

(86) PCT No.: PCT/KR2012/005223
§ 371 (c)(1),
(2), (4) Date: Jan. 23, 2014

(87) PCT Pub. No.: WO2013/015536
PCT Pub. Date: Jan. 31, 2013

(65) Prior Publication Data
US 2014/0151118 A1    Jun. 5, 2014

(30) Foreign Application Priority Data
Jul. 26, 2011    (KR) .......................... 10-2011-0074285

(51) Int. Cl.
*H01R 4/02*    (2006.01)
*H01R 13/405*    (2006.01)
(Continued)

(52) U.S. Cl.
CPC .............. *H01R 4/02* (2013.01); *H01R 12/59* (2013.01); *H01R 13/405* (2013.01);
(Continued)

(58) Field of Classification Search
CPC ........ H01R 4/02; H01R 12/59; H01R 13/506; H01R 13/5808; H01R 13/6658;
(Continued)

(56) References Cited

U.S. PATENT DOCUMENTS 4,963,699 A * 10/1990 Urushibata et al. ........ 174/88 R
5,041,019 A *  8/1991 Sharp .................... H01R 13/74
174/152 GM (Continued)

FOREIGN PATENT DOCUMENTS

CN    2599811 Y    1/2004
CN    101499568 A    8/2009
(Continued)

*Primary Examiner* — Ishwarbhai B Patel
*Assistant Examiner* — Paresh Paghadal
(74) *Attorney, Agent, or Firm* — Birch, Stewart, Kolasch & Birch, LLP

(57) ABSTRACT

Disclosed is a cable connection structure of a camera module for a vehicle, the cable connection structure including a cable unit having at least one wire member, a flexible printed circuit board (FPCB) having a terminal on one end thereof and having a connecting portion on the other end, the terminal being soldered to a wire metal piece exposed at an end of the wire member and having a number corresponding to a number of the wire member, the connecting portion being connected to the camera module, and a molded connector surrounding a joining portion between the cable unit and the FPCB.

11 Claims, 1 Drawing Sheet

(51) Int. Cl.
    *H05K 3/34*           (2006.01)
    *H01R 12/59*         (2011.01)
    *H01R 13/66*        (2006.01)
    *H01R 13/58*        (2006.01)
    *G08B 13/196*      (2006.01)
    *G03B 17/02*        (2006.01)
    *H04N 5/225*        (2006.01)
    *H05K 1/18*         (2006.01)

(52) U.S. Cl.
    CPC ............ *H05K 3/3405* (2013.01); *G03B 17/02* (2013.01); *G08B 13/19634* (2013.01); *H01R 13/5845* (2013.01); *H01R 13/6658* (2013.01); *H01R 13/6666* (2013.01); *H01R 13/6683* (2013.01); *H01R 2201/26* (2013.01); *H04N 5/2257* (2013.01); *H05K 1/189* (2013.01); *H05K 2201/10356* (2013.01)

(58) Field of Classification Search
    CPC ...... H01R 2201/26; H01R 2201/10356; H01R 13/6683; H01R 13/6666; H01R 13/5845; H05K 3/3405; H05K 1/189
    USPC ................ 174/50.52, 88 R; 361/749
    See application file for complete search history.

(56) References Cited

U.S. PATENT DOCUMENTS

| | | | | |
|---|---|---|---|---|
| 5,821,465 A | * | 10/1998 | Tanaka et al. | ............... 174/88 R |
| 5,957,727 A | * | 9/1999 | Page, Jr. | ............ H01R 13/5845 |
| | | | | 439/607.58 |
| 6,068,506 A | * | 5/2000 | Shen | .................... H01R 13/562 |
| | | | | 439/447 |
| 6,663,415 B1 | * | 12/2003 | Wu | .................... H01R 13/5808 |
| | | | | 439/460 |
| 7,165,977 B2 | * | 1/2007 | Jiang | ...................... H01R 12/62 |
| | | | | 439/493 |
| 7,304,661 B2 | * | 12/2007 | Ishikura | .................... B60R 1/00 |
| | | | | 348/143 |
| 7,503,809 B2 | * | 3/2009 | Tsai | ..................... H01R 13/622 |
| | | | | 439/668 |
| 7,922,520 B2 | * | 4/2011 | Mizukami | ........... H01R 13/6658 |
| | | | | 439/493 |
| 2002/0101041 A1 | * | 8/2002 | Kameyama | .......... H01R 13/521 |
| | | | | 277/628 |
| 2002/0121809 A1 | * | 9/2002 | Kameyama | ............ H01R 9/226 |
| | | | | 307/9.1 |
| 2002/0126457 A1 | * | 9/2002 | Kameyama | ........ H01R 13/6658 |
| | | | | 361/728 |
| 2004/0067680 A1 | * | 4/2004 | Wu | ..................... H01R 13/6589 |
| | | | | 439/497 |
| 2007/0298664 A1 | | 12/2007 | Tsai et al. | |
| 2009/0197459 A1 | | 8/2009 | Yu et al. | |
| 2010/0151705 A1 | * | 6/2010 | Su | ........................ H01R 13/502 |
| | | | | 439/67 |
| 2010/0188826 A1 | * | 7/2010 | Yeh | ........................ H01R 4/023 |
| | | | | 361/749 |
| 2011/0068174 A1 | * | 3/2011 | Miyoshi | ............. G06K 7/10722 |
| | | | | 235/462.11 |
| 2012/0252266 A1 | * | 10/2012 | Ling | ...................... H01R 9/038 |
| | | | | 439/581 |

FOREIGN PATENT DOCUMENTS

| | | |
|---|---|---|
| CN | 201323341 Y | 10/2009 |
| JP | 54-126993 A | 10/1979 |
| JP | 2003-323936 A | 11/2003 |
| JP | 2009-087855 A | 4/2009 |
| KR | 10-2008-0077838 A | 8/2008 |
| KR | 10-2009-0004094 A | 1/2009 |
| TW | 200803069 A | 1/2008 |

\* cited by examiner

CABLE CONNECTION STRUCTURE OF CAMERA MODULE FOR VEHICLE

TECHNICAL FIELD

The present invention relates to a cable connection structure of a camera module for a vehicle.

BACKGROUND ART

As a camera module is recently miniaturized and a storage space for storing an image is implemented as memory, various types of camera modules have been applied to a vehicle. When compared with cameras applied to portable electronic devices, such camera modules are easily susceptible to water and contaminants. Thus, a cable connection structure capable of preventing permeation of water and dust is required.

Generally, a cable coupled to a camera module has a connector on a base of a housing in which the camera module is installed, and a plug member coupled with the cable is connected to the connector. Further, in order to prevent water or dust from entering a junction between the connector and the plug member, a sealing member such as an O-ring is inserted into the junction. The connector and the plug member are connected to each other using a fixing member that is fastened by a screw-type fastening method and is made of a resin material.

However, such a connection structure is problematic in that the fixing member made of the resin material is continuously subjected to an elastic restoring force of the sealing member such as the O-ring, so that a portion of the fixing member corresponding to the sealing member may be bent or deformed.

Further, since a connecting operation must be performed using an additional fastening member such as a screw, with the O-ring being interposed between the connector and the plug member, it is difficult to automate an assembly operation and thereby the assembly operation is generally performed manually. As a result, assemblability is poor.

Furthermore, when the connection structure is comprised of the connector and the plug member, a mounting area of a printed circuit board increases, thus undesirably causing an increase in size of a part. In the case of a small-sized camera module, the plug member must be miniaturized. To this end, the cable comprises cables of different thicknesses, which are joined together using a joint member such as a joint terminal. It is cumbersome to implement such a configuration.

DISCLOSURE OF INVENTION

Technical Problem

Accordingly, the present invention provides a cable connection structure of a camera module for a vehicle, which is excellent in waterproof effect and dustproof effect and has improved assemblability.

Solution to Problem

In one general aspect of the present invention, there is provided a cable connection structure of a camera module for a vehicle, the cable connection structure comprising: a cable unit having at least one wire member; a flexible printed circuit board (FPCB) having a terminal on one end thereof and having a connecting portion on the other end, the terminal being soldered to a wire metal piece exposed at an end of the wire member and having a number corresponding to a number of the wire member, the connecting portion being connected to the camera module; and a molded connector surrounding a joining portion between the cable unit and the FPCB.

Preferably, the cable unit includes a separation preventing rib protruding from an outer circumference thereof to a predetermined height so as to prevent separation of the molded connector.

Preferably, the molded connector includes on an outer circumference thereof a coupling groove to be coupled to a cover member that is coupled to an external housing of the camera module.

Preferably, the cover member is made of any one of soft resin, rubber, and silicone rubber.

Preferably, the connecting portion comprises a ZIP connector.

Advantageous Effects of Invention

As apparent from the above description, the cable connection structure of the present invention is advantageous in that it prevents an inflow of contaminants including water and dust without using an additional sealing member such as an O-ring, and needs not perform an assembly operation manually, so that assemblability is improved.

BEST MODE FOR CARRYING OUT THE INVENTION

Hereinafter, a cable connection structure of a camera module for a vehicle according to the present invention will be described with reference to the accompanying drawings.

Figure 1:
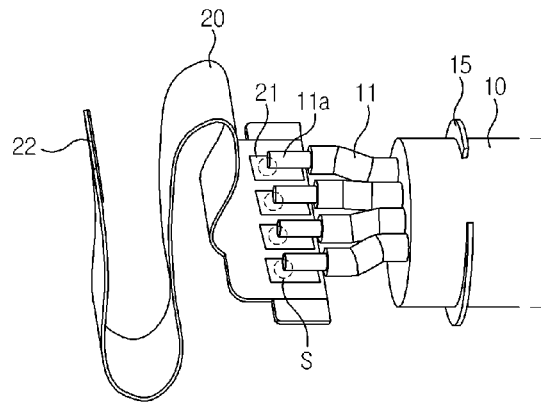
FIG. 1 is a perspective view illustrating a state in which a flexible printed circuit board (FPCB) and wires are connected to each other by soldering.
Figure 2:
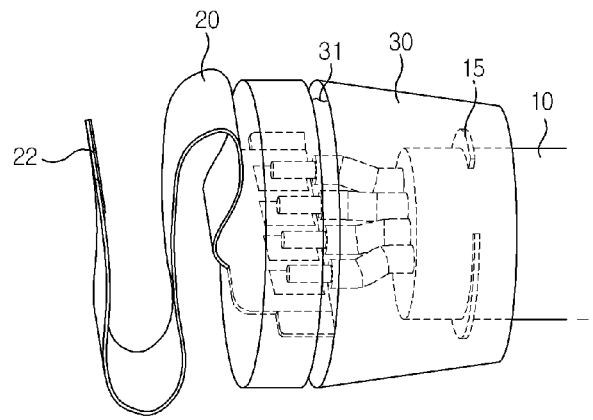
FIG. 2 is a perspective view illustrating a state in which a connector is formed by a molding member, at a position where the FPCB and the wires of FIG. 1 are soldered.
Figure 3:
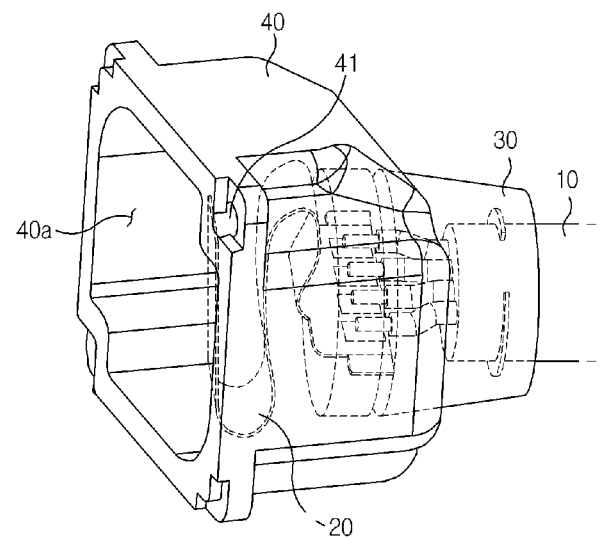
FIG. 3 is a perspective view illustrating a state in which the connector is connected to a base of a camera module for a vehicle.

As shown in FIGS. 1 to 3, the cable connection structure of the camera module for the vehicle according to the present invention includes a cable unit 10, a flexible printed circuit board (FPCB) 20, and a connector 30.

Referring to FIG. 1, the cable unit 10 includes at least four wire members 11 therein, each of the wire members 11 individually having a sheath. A wire metal piece 11a of each wire member 11 is exposed at an end of the wire member 11 for the purpose of connection. In order to prevent impurities including water from entering the wire members 11, all the wire members 11 of the cable unit 10 have external sheaths that are formed of a thermal shrinkage cable or the like.

In order to prevent separation of the connector 30 that will be described below in detail, a separation preventing rib 15 is provided at a position near the end of the cable unit 10 in such a way as to protrude outwards from an outer circumference thereof. Operation of the separation preventing rib 15 will be described again later.

The FPCB 20 is made of a flexible material, and has a plurality of wiring circuits therein. The respective wiring circuits are conductively connected to the wire members 11 of the cable unit 10 to transceive power and signals with the wire members 11. The FPCB includes a plurality of terminals 21 on one end thereof, and a connecting portion 22 on the other end thereof. The terminals 21 are joined to the wire metal pieces 11a exposed at ends of the wire members 11 by soldering S. The connecting portion 22 is connected to a connector of the camera module for the vehicle (not shown).

The connecting portion 22 may be embodied in various types. According to the preferred embodiment of the present invention, it is preferable that the connecting portion 22 comprise a ZIP connector. Since the ZIP connector is small in volume for connection and enables connection and disconnection through snap fitting, the ZIP connector is suitable for connection of the terminals of the FPCB.

The connector 30 functions to seal a joining portion between the cable unit 10 and the FPCB 20. As shown in FIG. 2, the connector 30 is configured so that a soldering portion between the FPCB 20 and the cable unit 10 is located in a mold. Thereby, after molding is formed, only the connecting portion 22 of the FPCB 20 is exposed at one end of the connector 30, and only a sheath of the cable unit 10 is exposed at the other end. Such a configuration prevents the terminals 21 undergoing the soldering operation from being exposed to an outside, thus preventing a short-circuit or a malfunction from occurring due to an inflow of water or contaminants.

Meanwhile, as shown in FIG. 2, the separation preventing rib 15 protruding from the cable unit 10 is configured to be located in the mold together with the joining portion between the cable unit 10 and the FPCB 20 when the connector 30 is formed, thus allowing the separation preventing rib 15 to be positioned in the connector 30. The separation preventing rib 15 can prevent the connector 30 from being separated from the cable unit 10, even if the connector 30 is subjected to a force in a longitudinal direction of the cable unit 10.

A coupling groove 31 having a predetermined depth is provided along an outer circumference of the connector 30. The coupling groove 31 is used to couple the connector 30 with a cover member 40 that is assembled with an external housing (not shown) of the camera module. The cover member 40 may be made of any one of soft resin, rubber, and silicone rubber. The cover member 40 may have on an end thereof a screw hole 41 to which a screw is fastened. Preferably, the cover member 40 takes a shape of a cup having an opening 40a at a position corresponding to the external housing so that the cover member 40 is assembled with the external housing (not shown).

As described above, the present invention obviates the necessity of inserting the separate sealing member such as the O-ring to provide a waterproof structure in cable connecting and fixing operation, thus simplifying an assembly operation, and eliminates operation of manually installing the sealing member and the fixing unit, thus improving productivity owing to process automation.

Further, since the molded connector 30 for connecting the cable unit 10 with the FPCB 20 is manufactured as a single part, the number of parts is reduced and a reduction in manufacturing cost is achieved.

Further, since it has only to snap-fit the connecting portion, provided on the end of the FPCB 20 and comprising the ZIP connector 22, into the camera module, the assembly is convenient.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

INDUSTRIAL APPLICABILITY

As described above, the present invention provides a cable connection structure of a camera module for a vehicle, which can be applied to a cable connection structure of electronic equipment installed at a position frequently exposed to contaminants, such as water or dust.

The invention claimed is:

1. A cable connection structure of a camera module for a vehicle, comprising:
    a cable unit having at least one wire member comprising a wire metal piece;
    a flexible printed circuit board (FPCB) having at least one terminal on one end thereof and having a connecting portion on the other end, wherein each terminal is configured to be soldered to the corresponding wire metal piece exposed at an end of the wire member to form a joining portion between the cable unit and the FPCB, and wherein a number of the terminal corresponds to a number of the wire member; and
    a connector comprising the cable unit soldered to the FPCB and comprising a truncated conical shaped front portion having a large diameter, a cylindrical rear portion having a small diameter and a coupling groove formed along on an outer circumference between the front portion and the rear portion,
    wherein the cable unit includes a separation preventing rib protruding from an outer circumference at a distal end thereof corresponding to the rear portion of the connector to a predetermined height,
    wherein the connector is configured to be molded in a mold, and
    wherein the joining portion is located in the front portion and the separation preventing rib is located in the rear portion such that the Joining portion is sealed and the molded connector is prevented from being separated from the cable unit, and
    the joining portion is molded in the front portion and the separation preventing rib is molded in the rear portion.

2. The cable connection structure as set forth in claim 1, wherein the cover member is made of any one of soft resin, rubber, and silicone rubber.

3. The cable connection structure as set forth in claim 1, wherein an end of the molded connector distal from the separation preventing rib is sealed such that only the FPCB is exposed through said end.

4. The cable connection structure as set forth in claim 1, wherein the separation preventing rib is protrusively formed to a direction perpendicular to a length direction of the wire member.

5. The cable connection structure as set forth in claim 4, wherein the separation preventing rib is formed with a cut out in a circumferential direction thereof.

6. The cable connection structure as set forth in claim 4, wherein the separation preventing rib is positioned in the connector to be molded with the connector.

7. The cable connection structure as set forth in claim 6, wherein the molded connector is an integral single part with the cable unit and the FPCB.

8. The cable connection structure as set forth in claim 7, wherein only the connecting portion of the FPCB is exposed at one end of the molded connector, and wherein only a sheath of the cable unit is exposed at the other end of the molded connector.

9. The cable connection structure as set forth in claim 7, wherein the coupling groove has a predetermined depth and is coupled with a cover member of the camera module.

10. The cable connection structure as set forth in claim 9, wherein the cover member takes a shape of a cup having an opening to receive the camera module.

11. The cable connection structure as set forth in claim 10, wherein the cover member comprises a screw hole for a fastener to assemble the cover member to the vehicle.

\* \* \* \* \*